(12) United States Patent
Pan et al.

(10) Patent No.: US 12,073,863 B2
(45) Date of Patent: Aug. 27, 2024

(54) MEMORY AND ELECTRONIC DEVICE

(71) Applicant: HUAWEI TECHNOLOGIES CO., LTD., Guangdong (CN)

(72) Inventors: Yue Pan, Shenzhen (CN); Yanxiang Liu, Shenzhen (CN); Stephane Badel, Leuven (BE)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 332 days.

(21) Appl. No.: 17/387,588

(22) Filed: Jul. 28, 2021

(65) Prior Publication Data
US 2021/0358531 A1    Nov. 18, 2021

Related U.S. Application Data

(63) Continuation of application No. PCT/CN2019/074012, filed on Jan. 30, 2019.

(51) Int. Cl.
*G11C 11/16* (2006.01)
(52) U.S. Cl.
CPC ...... *G11C 11/1675* (2013.01); *G11C 11/1655* (2013.01); *G11C 11/1657* (2013.01); *G11C 11/1673* (2013.01)
(58) Field of Classification Search
CPC ............ G11C 11/1675; G11C 11/1655; G11C 11/1657; G11C 11/1673
See application file for complete search history.

(56) References Cited

U.S. PATENT DOCUMENTS

| | | | |
|---|---|---|---|
| 7,184,301 B2* | 2/2007 | Sugibayashi | G11C 11/16 365/158 |
| 8,009,466 B2* | 8/2011 | Sakimura | G11C 11/1673 365/158 |
| 8,670,264 B1 | 3/2014 | Abedifard et al. | |
| 8,902,644 B2* | 12/2014 | Sakimura | G11C 11/1655 365/158 |

(Continued)

FOREIGN PATENT DOCUMENTS

| | | |
|---|---|---|
| CN | 103854693 A | 6/2014 |
| CN | 105580083 A | 5/2016 |
| JP | 2013127829 A | 6/2013 |

OTHER PUBLICATIONS

Kiuyuan Bi et al., STT-RAM Designs Supporting Dual-port Accesses, 2013, 6 pages.

*Primary Examiner* — Son L Mai
(74) *Attorney, Agent, or Firm* — James Harrison

(57) ABSTRACT

A memory and an electronic device are provided. The memory includes a storage element (10), a first transistor (21), a second transistor (22), a first bit line (BLA), and a second bit line (BLB). The storage element (10) is coupled to the first bit line (BLA) and the second bit line (BLB) by separately using the first transistor (21) and the second transistor (22), and the first transistor (21) and the second transistor (22) are turned on during a write operation. When the foregoing solution is used, compared with providing a required write current by using one transistor, providing the write current by using the two transistors may enable a smaller transistor to meet a requirement, thereby reducing an area required by the entire memory. In addition, the memory in this application can still support a dual-port feature in a read operation.

14 Claims, 8 Drawing Sheets

(56) References Cited

U.S. PATENT DOCUMENTS

| | | | |
|---|---|---|---|
| 9,520,173 B1 * | 12/2016 | Baker, Jr. ................ | G11C 11/16 |
| 2003/0223283 A1 | 12/2003 | Kunikiyo | |
| 2005/0195658 A1 | 9/2005 | Sousa et al. | |
| 2008/0310213 A1 | 12/2008 | Chen et al. | |
| 2013/0114336 A1 | 5/2013 | Li et al. | |
| 2016/0343436 A1 | 11/2016 | Roy et al. | |

* cited by examiner

MEMORY AND ELECTRONIC DEVICE

CROSS-REFERENCE TO RELATED APPLICATIONS

This application is a continuation of International Application No. PCT/CN2019/074012, filed on Jan. 30, 2019, the disclosure of which is hereby incorporated by reference in its entirety.

TECHNICAL FIELD

This application relates to the field of information technologies, and in particular, to a memory and an electronic device.

BACKGROUND

Spin-transfer torque magnetic random access memory (STT-MRAM) is a novel memory with great potential, which has advantages such as a relatively high reading speed, a long endurance, high integration, and compatibility with a complementary metal oxide semiconductor process.

As shown in FIG. 1a and FIG. 1b, a magnetic tunnel junction (MTJ) is a storage element 10 in the STT-MRAM, and generally includes two ferromagnetic layers and a thin tunneling oxide layer 12 (for example, magnesium oxide) sandwiched between the two ferromagnetic layers. One ferromagnetic layer, whose magnetization is fixed along a direction of an easy magnetization axis, is referred to as a fixed layer 13. The other ferromagnetic layer, whose magnetization may be flipped freely between two orientations, is referred to as a free layer 11. Still referring to FIG. 1a and FIG. 1b, where a direction of an arrow represents a magnetization orientation, when a magnetization orientation of the free layer 11 is the same as a magnetization orientation of the fixed layer 13, as shown in FIG. 1a, resistance of the MTJ has a relatively low resistance value. When the magnetization orientation of the free layer 11 is opposite to the magnetization orientation of the fixed layer 13, as shown in FIG. 1b, the resistance of the MTJ has a relatively high resistance value.

As shown in FIG. 2, in the STT-MRAM, the storage element is usually a 1T1MTJ structure including one transistor and one MTJ, and has three ends that are respectively connected to a word line (Word Line, WL), a bit line (Bit Line, BL), and a source line (Source Line, SL). During reading, stored information depends on a read MTJ resistance value, and a current direction may be any direction. During writing, a corresponding current direction is required for writing a specific state (AP or P) (FIG. 2).

In some applications, such as a multi-processor system, addresses in a storage array sometimes need to be read at the same time. In this case, the array needs to have a plurality of ports. There are several existing common methods that can increase a bandwidth of the memory, which, however, decrease other indicators at the same time. For example, the bandwidth may be increased by increasing an input/output quantity of the storage array, but this will cause a memory layout to be flat, and cause a read latency to be increased to some extent, and a range within which the input/output quantity can be increased is limited. For another example, the bandwidth may be increased by reducing an array size to increase a total quantity of arrays, but this will increase a proportion of peripheral circuits, thereby increasing an area of the entire memory.

SUMMARY

This application provides a memory, to reduce a memory size.

According to a first aspect, a memory is provided. The memory includes: a storage element configured to store data; two transistors configured to write or read the storage element, namely, a first transistor and a second transistor; and two bit lines, namely, a first bit line and a second bit line. The storage element is coupled to the first bit line and the second bit line by separately using the first transistor and the second transistor. The first transistor and the second transistor are configured to control writing and reading of the storage element. During writing, the first transistor and the second transistor are turned on together during a write operation. During reading, one of the first transistor and the second transistor is turned on during a reading operation. During writing, both a turn-on current of the first transistor and a turn-on current of the second transistor are less than a write current of the storage element, and a sum of the turn-on current of the first transistor and the turn-on current of the second transistor is greater than one time of the write current of the storage element but less than two times of the write current of the storage element. In this way, when used in parallel, the two transistors can provide the write current required by the storage element. Compared with providing a required write current by using one transistor, providing the write current by using the two transistors may enable a smaller transistor to meet a requirement, thereby reducing an area required by the entire memory. In addition, the memory in this application can still support a dual-port feature in a read operation.

It should be noted that "the first transistor and the second transistor are turned on together" in this application means that both the first transistor and the second transistor are in an on state at a moment in a process of the write operation, so that an adequate write current can be provided.

In a specific implementation, the memory further includes a first word line and a second word line. The first word line and the second word line are respectively coupled to a gate of the first transistor and a gate of the second transistor. That is, the first word line is coupled to the gate of the first transistor, and the second word line is coupled to the gate of the second transistor.

In a specific implementation, the memory further includes a control circuit. The control circuit is configured to control the first transistor and the second transistor to be turned on or off. Specifically, the control circuit turns on or off the first transistor and the second transistor by using separately the first word line and the second word line. A write operation and a read operation are implemented through control of the control circuit.

In a specific implementation, the storage element includes a first end and a second end, the first end is coupled to the first transistor and the second transistor, and the second end is coupled to a source line.

When sources and drains of the first transistor and the second transistor are specifically disposed, the first transistor and the second transistor share an active area. Therefore, the sources and the drains of the first transistor and the second transistor are disposed in the same active area.

The first transistor and the second transistor are transistors of a same type. For example, both the first transistor and the second transistor are fin-type field effect transistors, or both the first transistor and the second transistor are planar transistors.

According to a second aspect, an electronic device is provided. The electronic device includes the forgoing memory. A write current is provided by using two transistors, so that a smaller transistor can meet a requirement, thereby reducing an area required by the entire memory. In addition, the memory in this application can still support a dual-port feature in a read operation.

According to a third aspect, a memory is provided. The memory includes a plurality of storage structures arranged in a rectangular array, and a plurality of groups of bit lines that are in a one-to-one correspondence with a plurality of columns of the rectangular array. Each group of bit lines includes a first bit line and a second bit line. Each of the plurality of storage structures includes a storage element, a first transistor, and a second transistor. The storage element is coupled to a corresponding first bit line and a corresponding second bit line by separately using the first transistor and the second transistor based on a row in which the storage structure is located in the rectangular array. In addition, the first transistor and the second transistor are turned on together when a write operation is performed on the storage element. During writing, both a turn-on current of the first transistor and a turn-on current of the second transistor are less than a write current of the storage element, and a sum of the turn-on current of the first transistor and the turn-on current of the second transistor is greater than one time of the write current of the storage element but less than two times of the write current of the storage element. In this way, when used in parallel, the two transistors can provide the write current required by the storage element. During data reading, either of the transistors may be used for reading. When the foregoing solution is used, during reading, two ports can be used for reading, and during writing, one write request can be processed. In addition, when the structure is used, a structure of the first transistor and the second transistor can be improved, so that an area of the memory may be similar to an area of a conventional single-port memory, thereby reducing an area of the entire memory.

In a specific implementation, the memory further includes a plurality of groups of word lines that are in a one-to-one correspondence with a plurality of rows of the rectangular array, each group of word lines includes a first word line and a second word line, and a gate of the first transistor and a gate of the second transistor are coupled to a corresponding first word line and a corresponding second word line respectively based on the row in which the storage structure is located in the rectangular array.

When a write operation and a read operation are specifically implemented, the memory further includes a control circuit. The control circuit is configured to turn on or off the first transistor and the second transistor by using the first word line and the second word line. The control circuit and the read operation are controlled by using the control circuit.

In a specific implementation, the storage element is a magnetic tunnel junction.

In a specific implementation, in each column of storage structures, first transistors and second transistors are alternately arranged in pairs except transistors located at head and tail ends.

In addition, when disposed, the first transistor and the second transistor share an active area. In this way, the area of the memory is further reduced.

When the bit lines are specifically disposed, adjacent first transistors share a first contact hole to connect to the first bit line, and adjacent second transistors share a second contact hole to connect to the second bit line. This further reduces the area of the memory.

According to a fourth aspect, an electronic device is provided. The electronic device includes the foregoing memory. A write current is provided by using two transistors, so that a smaller transistor can meet a requirement, thereby reducing an area required by the entire memory. In addition, the memory in this application can still support a dual-port feature in a read operation.

DESCRIPTION OF EMBODIMENTS

To make the objectives, technical solutions, and advantages of this application clearer, the following further describes this application in detail with reference to the accompanying drawings.

For ease of understanding a memory provided in the embodiments of this application, the following first describes an application scenario of the memory provided in the embodiments of this application. The memory is applied to data storage, including data writing and reading. When used, memories are usually arranged in an array. When a plurality of addresses need to be read at the same time, a plurality of ports need to be used. When a first row of memories and a second row of memories need to be read, two bit lines are required to read the memories separately. In this case, the memory needs to have two ports. To adapt to a plurality of ports, an embodiment of this application provides a memory. The following describes the memory in detail with reference to accompanying drawings.

Figure 1A:
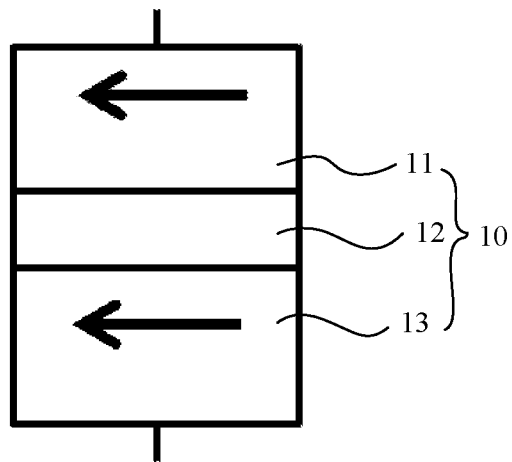
FIG. 1a and FIG. 1b show an MTJ structure in the conventional technology.
Figure 1B:
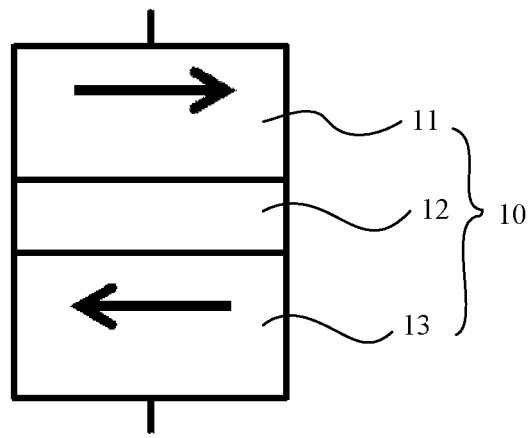
Figure 2:
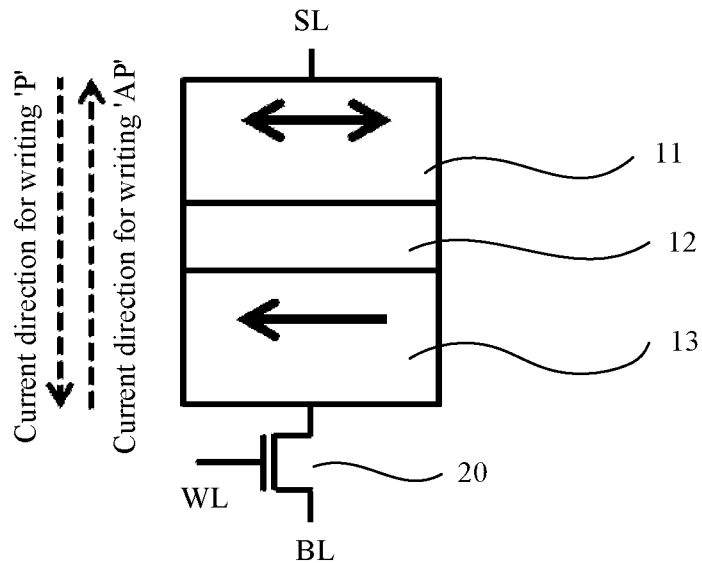
FIG. 2 is a schematic structural diagram of a memory in the conventional technology.
Figure 3:
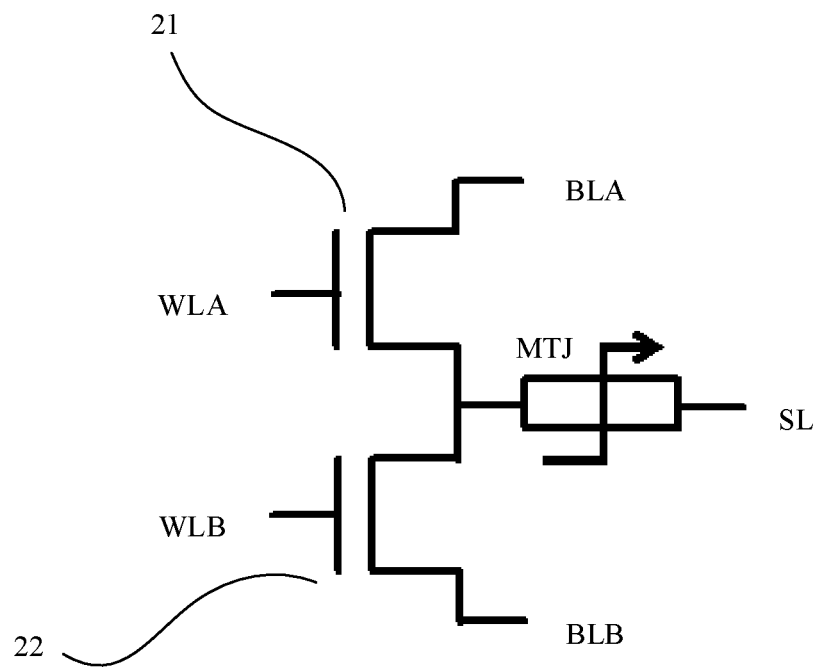
FIG. 3 is a schematic structural diagram of a memory according to this application.

FIG. 3 is a schematic structural diagram of a memory according to this disclosure. Referring now to FIG. 3, a structure of a memory according to an embodiment of this application is illustrated. The memory includes a storage element configured to store data. In the structure shown in FIG. 3, the storage element is a magnetic tunnel junction (MTJ. FIG. 1a and FIG. 1b showed a conventional storage element 10 that includes two ferromagnetic layers and a thin tunneling oxide layer 12 (for example, MgO) sandwiched between the two ferromagnetic layers. One ferromagnetic layer is formed having a fixed magnetization direction and is shown as fixed layer 13. The other ferromagnetic layer, whose magnetization orientation may be flipped freely between two orientations, is referred to as a free layer 11. When a magnetization orientation of the free layer 11 is the same as a magnetization orientation of the fixed layer 13, as shown in FIG. 1a, resistance of the MTJ has a relatively low resistance value. When the magnetization orientation of the free layer 11 is opposite to the magnetization orientation of the fixed layer 13, as shown in FIG. 1b, the resistance of the MTJ has a relatively high resistance value. When the storage element 10 is read, stored information depends on a read MTJ resistance value, and a current direction may be any direction. However, when the storage element 10 is written, a corresponding current direction is required for writing a specific state (AP or P), and the writing can be performed only when a write current of the storage element 10 is met.

Referring back to FIG. 3, when writing and reading are specifically controlled, a transistor is used for control in the memory provided in this embodiment of this application. In addition, to correspond to a plurality of ports, two transistors and two bit lines are disposed in the memory provided in this embodiment of this application. For ease of describing the two transistors and the two bit lines, the two transistors are respectively named a first transistor 21 and a second transistor 22, and the two bit lines are respectively named a first bit line (BLA) and a second bit line (BLB). When connected, the storage element 10 is coupled to the first bit line BLA and the second bit line BLB by separately using the first transistor 21 and the second transistor 22. Each transistor includes a gate, a source, and a drain. The gate is configured to control a channel between the source and the drain to be turned on to form a path. When the transistor is specifically disposed, a fin-type field effect transistor or a planar transistor may be used.

The memory further includes a first word line (WLA) and a second word line (WLB). When the first transistor 21 and the second transistor 22 are connected to the storage element, the gate of the first transistor 21 is connected to the WLA, and the source and the drain are respectively connected to the BLA and the storage element (MTJ). During specific connection, the source may be connected to the BLA, and the drain may be connected to the fixed layer 13 (first end) of the storage element. Alternatively, the drain may be connected to the BLA, and the source may be connected to the fixed layer 13 (first end) of the storage element. When the second transistor 22 is connected to the storage element, the gate of the second transistor 22 is connected to the WLB, and the source and the drain are respectively connected to the BLB and the storage element. During specific connection, the source of the second transistor 22 may be connected to the BLB, and the drain of the second transistor 22 may be connected to the fixed layer 13 (first end) of the storage element. Alternatively, the drain may be connected to the BLB, and the source may be connected to the storage element. The first transistor 21 and the second transistor 22 may both use P-type transistors, or both use N-type transistors. Optionally, the source of the first transistor 21 and the source of the second transistor 22 are connected to the storage element, or the drain of the first transistor 21 and the drain of the second transistor 22 are connected to the storage element.

Figure 4:
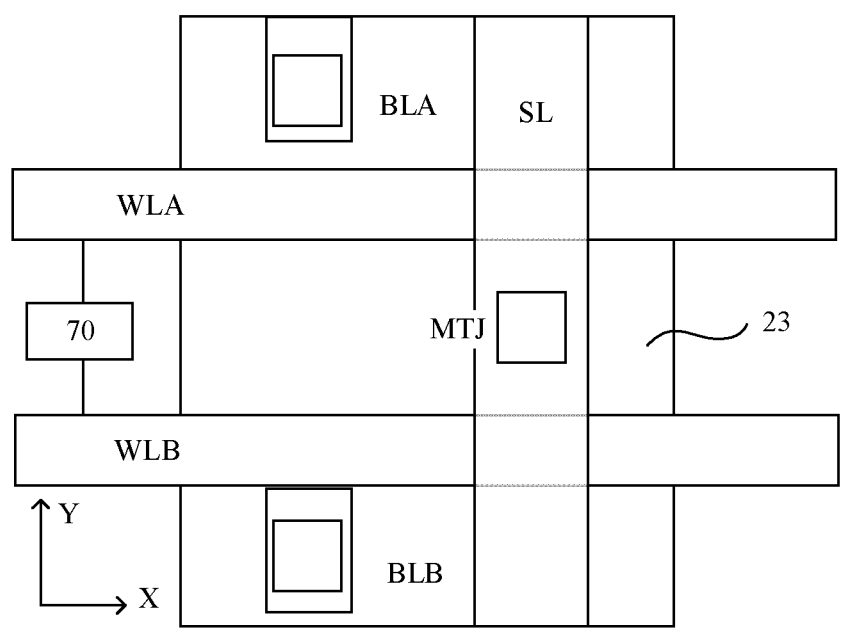
FIG. 4 shows a layout of a memory according to an embodiment of this application.

To intuitively understand connections between the first transistor 21 and the storage element and between the second transistor 22 and the storage element, refer to FIG. 3 and FIG. 4. FIG. 3 is a schematic diagram when the first transistor 21 and the second transistor 22 are connected to the storage element. FIG. 4 shows a layout when the first transistor 21 and the second transistor 22 are connected to the storage element. First, referring to FIG. 3, it can be learned from FIG. 3 that the first transistor 21 and the second transistor 22 are connected in parallel. The gate of the first transistor 21 is connected to the WLA, and the gate of the second transistor 22 is connected to the WLB. The source of the first transistor 21 is connected to BLA, and the source of the second transistor 22 is connected to the BLB. In addition, the drain of the first transistor 21 and the drain of the second transistor 22 are both connected to the fixed layer 13 (first end) of the storage element. Alternatively, the source of the first transistor 21 and the source of the second transistor 22 are both connected to the fixed layer 13 (first end) of the storage element. In addition, the free layer 11 (second end) of the storage element is connected to a source line (SL).

When the first transistor 21 and the second transistor 22 are specifically disposed, the first transistor 21 and the second transistor 22 are turned on together during a write operation. It should be noted that "the first transistor and the second transistor are turned on together" in this application means that both the first transistor and the second transistor are in an on state at a moment in a process of the write operation, so that an adequate write current can be provided. Therefore, when the first transistor 21 and the second transistor 22 are disposed, both a turn-on current of the first transistor 21 and a turn-on current of the second transistor 22 provided in this embodiment of this application are less than a write current of the storage element. In addition, a sum of the turn-on current of the first transistor 21 and the turn-on current of the second transistor 22 is greater than or equal to one time of the write current of the storage element but less than two times of the write current of the storage element. For ease of description, the turn-on current of the first transistor 21 is named I1, the turn-on current of the second transistor 22 is named I2, and the write current of the storage element is named I3. In this case, I1, I2, and I3 meet $I3 \leq I1+I2 < 2*I3$. Alternatively, I1, I2, and I3 may meet $I3 \leq I1+I2 \leq 1.5*I3$. During specific setting, I1+I2 may be different values such as I3, 1.2*I3, 1.4*I3, or 1.5*I3. In a specific implementation, the turn-on current I1 of the first transistor 21 and the turn-on current I2 of the second transistor 22 meet I1+I2=I3. In addition, during setting, the turn-on current of the first transistor 21 is equal to the turn-on current of the second transistor 22, that is, I1=I2.

For a planar transistor, a factor that determines a turn-on current of the planar transistor is a channel width of the transistor. Therefore, in the conventional technology, when a write operation of a storage element is controlled by using a single transistor, a turn-on current of the transistor is at least equal to a write current of the storage element. In this embodiment of this application, the turn-on currents of both the first transistor and the second transistor are less than the write current of the storage element. Therefore, a channel width of each transistor provided in this embodiment of this application is less than a channel width of the transistor used in the conventional technology. When I1=I2, a channel width of the first transistor 21 is equal to a channel width of the second transistor 22, and may be equal to half of a channel width of a transistor in a single-port memory in the conventional technology. In the transistors provided in this embodiment of this application, the source and the drain of each transistor is disposed in an active area 23. Therefore, a channel width of the transistor may be equivalent to a width of the active area 23. In the structure provided in this embodiment of this application, as shown in FIG. 4, the first transistor 21 and the second transistor 22 may share an active area 23. In other words, the first transistor 21 and the second transistor 22 use the same active area 23. Certainly, the first transistor 21 and the second transistor 22 may not alternatively share an active area. In this case, the first transistor 21 and the second transistor 22 each correspond to one active area.

FIG. 4 shows a layout of a memory according to an embodiment of this disclosure. Referring now to FIG. 4, an XY coordinate system is established for use in the description. In a structure shown in FIG. 4, both the first transistor 21 and the second transistor 22 are planar transistors, and the two transistors share an active area 23. Therefore, a channel width may be equivalent to a width of the active area 23. As shown in FIG. 4, because the first transistor 21 and the second transistor 22 share the active area 23, channel widths of the first transistor 21 and the second transistor 22 are equal, that is, I1=I2. FIG. 4 further shows a location relationship between the WLA and the WLB. The WLA and the WLB are horizontally laid and arranged in a Y direction, the SL is vertically laid, and a plurality of SLs are arranged in an X direction. For ease of understanding the memory provided in this embodiment of this application, processes of a write operation and a read operation of the memory are described in detail in this embodiment of this application. When the write operation and the read operation are performed, the memory further includes a control circuit 70. The control circuit 70 is configured to turn on or off the first transistor and the second transistor by using the first word line and the second word line. In other words, the first transistor and the second transistor are controlled by using the control circuit 70.

During reading, the first transistor is turned on, or the second transistor is turned on, or both the first transistor and the second transistor are turned on, to read the storage element.

For example, when the WLA is used for reading, the WLA is set to a high voltage, the SL is connected to a low voltage, and the BLA is set to a read voltage Vr. A sense amplifier (a peripheral circuit connected to the memory) then compares a read current flowing through the BLA with a current on a reference branch to determine information stored in the storage element. A method of using the WLB for reading is similar thereto, and even if the WLA and the WLB are used to read a same unit, mutual interference does not occur. Therefore, the storage element in this application may support reading a maximum of two addresses at the same time.

Figure 5:
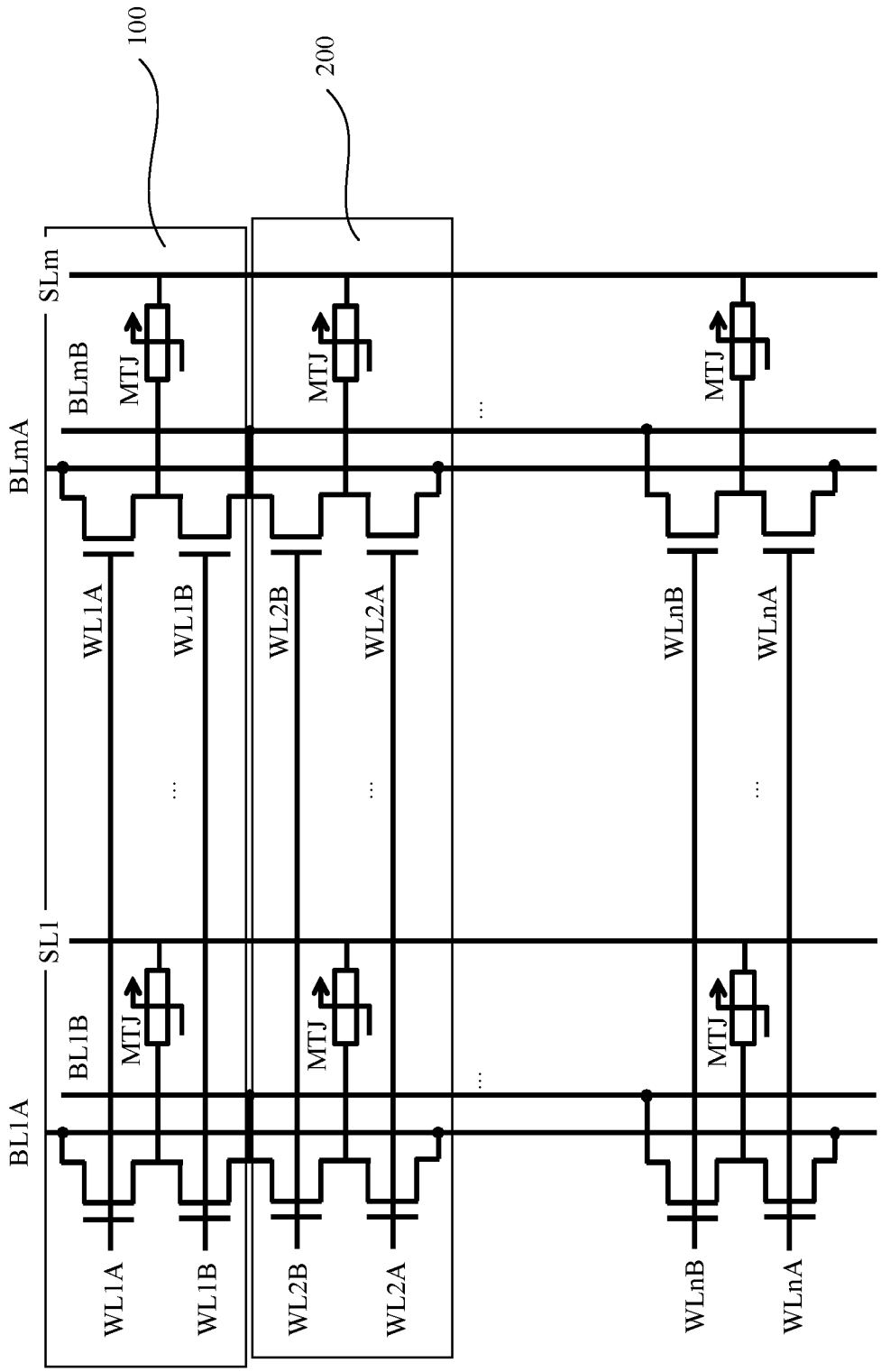
FIG. 5 is a schematic diagram of a memory array according to this application.

FIG. 5 is a schematic diagram of a memory array according to this disclosure. As shown in FIG. 5, different rows of memories may be read during reading. The first memory row 100 and the second memory row 200 in FIG. 5 are used as an example. During reading, the first memory row 100 is read by using the BLA, and the second memory row 200 is read at the same time by using the BLB. When memories are arranged in an array, the WLA refers to a word line connected to a first transistor 21 in each memory, and the WLB refers to a word line connected to a second transistor 22 in each memory. In addition, word lines in different rows are represented by WLnA and WLnB, where n is a positive integer greater than or equal to 1. Similarly, bit lines arranged in different columns are represented by BLmA and BLmB, and source lines in different columns are represented by SLm, where m is a positive integer greater than or equal to 1.

During writing, the first transistor and the second transistor are turned on at the same time for writing to the storage element. In this case, the WLA and the WLB are both set to a high level, and the BLA and the BLB are also set to a same voltage. For example, for a magnetic tunnel junction with a reference layer at a bottom layer, when a P state is written, the BLA and the BLB are both connected to a low voltage, and the SL is connected to a high level. When an AP state is written, both the BLA and the BLB are connected to a high level, and the SL is connected to a low voltage. In this case, a sum of the turn-on current I1 of the first transistor 21 and the turn-on current I2 of the second transistor 22 after parallel connection is equal to a current flowing through the storage element. Because the turn-on current I1 of the first transistor 21 and the turn-on current I2 of the second transistor 22 are greater than or equal to the write current I3 of the storage element, in this case, the storage element may be written.

It can be learned from the foregoing description that the memory provided in this embodiment of this application may implement multi-port reading, and may process one write request. For a memory, a read operation is more frequent and important than a write operation. Therefore, in the memory provided in this embodiment of this application, based on an operating characteristic of the memory, the first transistor and the disposed second transistor are disposed for multi-port reading and single-port writing. Compared with the conventional technology in which two transistors are separately used for reading and writing, the memory provided in this embodiment of this application can implement reading from and writing to storage. In addition, both the turn-on current of the first transistor 21 and the turn-on current of the second transistor 22 are less than the write current of the storage element. Compared with providing a required write current by using one transistor, providing the write current by using the two transistors may enable a smaller transistor to meet a requirement, thereby reducing an area required by the entire memory. In addition, the memory in this application can still support a dual-port feature in a read operation. Compared with the conventional technology in which two separate transistors are used for reading and writing, an area occupied by the memory is greatly reduced.

It should be understood that, in the foregoing embodiment, an example in which both the first transistor 21 and the second transistor 22 are planar transistors is used for description. However, the first transistor 21 and the second transistor 22 provided in the embodiments of this application may alternatively be other types of transistors. For example, the first transistor and the second transistor may alternatively be fin-type field effect transistors. A function of the fin-type field effect transistor is similar to a function of the transistor described above, and details are not described herein again. The first transistor 21 and the second transistor 22 may be considered to both select a planar transistor, or the first transistor 21 and the second transistor 22 may both use a fin-type field effect transistor.

For the storage element, in addition to the MTJ used as an example, another type of storage element, for example, a resistive random access memory (Resistive Random Access Memory, (RRAM)), may be used to implement a same effect.

In addition, an embodiment of this application further provides a memory. The memory includes a plurality of storage structures arranged in a rectangular array, and a plurality of groups of bit lines that are in a one-to-one correspondence with a plurality of columns of the rectangular array. Each group of bit lines includes a first bit line and a second bit line. Each of the plurality of storage structures includes a storage element, a first transistor, and a second transistor. The storage element is coupled to a corresponding first bit line and a corresponding second bit line by separately using the first transistor and the second transistor based on a row in which the storage structure is located in the rectangular array. The first transistor and the second transistor are turned on at the same time during a write operation.

When the memory is specifically disposed, the memory further includes a plurality of groups of word lines that are in a one-to-one correspondence with a plurality of rows of the rectangular array, each group of word lines includes a first word line and a second word line, and a gate of the first transistor and a gate of the second transistor are coupled to a corresponding first word line and second word line respectively based on the row in which the storage structure is located in the rectangular array. For a specific manner of connecting each storage element to the first transistor, the second transistor, the first word line, the second word line, the first bit line, and the second bit line, refer to the foregoing corresponding descriptions in FIG. 3 and FIG. 5. In addition, operating manners of the first transistor and the second transistor when a write operation and a read operation are performed are also the same as above. Therefore, details are not described herein again. In addition, the first transistor and the second transistor are also specifically controlled by using a control circuit, and the control circuit turns on or off the first transistor and the second transistor by using the first word line and the second word line.

In addition, an embodiment of this application provides an electronic device. The electronic device includes the memory according to any one of the foregoing. When the memory is used, the memory may implement multi-port reading, and may process one write request. For a memory, a read operation is more frequent and important than a write operation. Therefore, in the memory provided in this embodiment of this application, based on an operating characteristic of the memory, the first transistor and the disposed second transistor are disposed for multi-port reading and single-port writing. Compared with the conventional technology in which two transistors are separately used for reading and writing, the memory provided in this embodiment of this application can implement reading from and writing to storage. In addition, both the turn-on current of the first transistor 21 and the turn-on current of the second transistor 22 are less than the write current of the storage element. Compared with providing a required write current by using one transistor, providing the write current by using the two transistors may enable a smaller transistor to meet a requirement, thereby reducing an area required by the entire memory. In addition, the memory in this application can still support a dual-port feature in a read operation. Compared with the conventional technology in which two separate transistors are used for reading and writing, an area occupied by the memory is greatly reduced.

Figure 6:
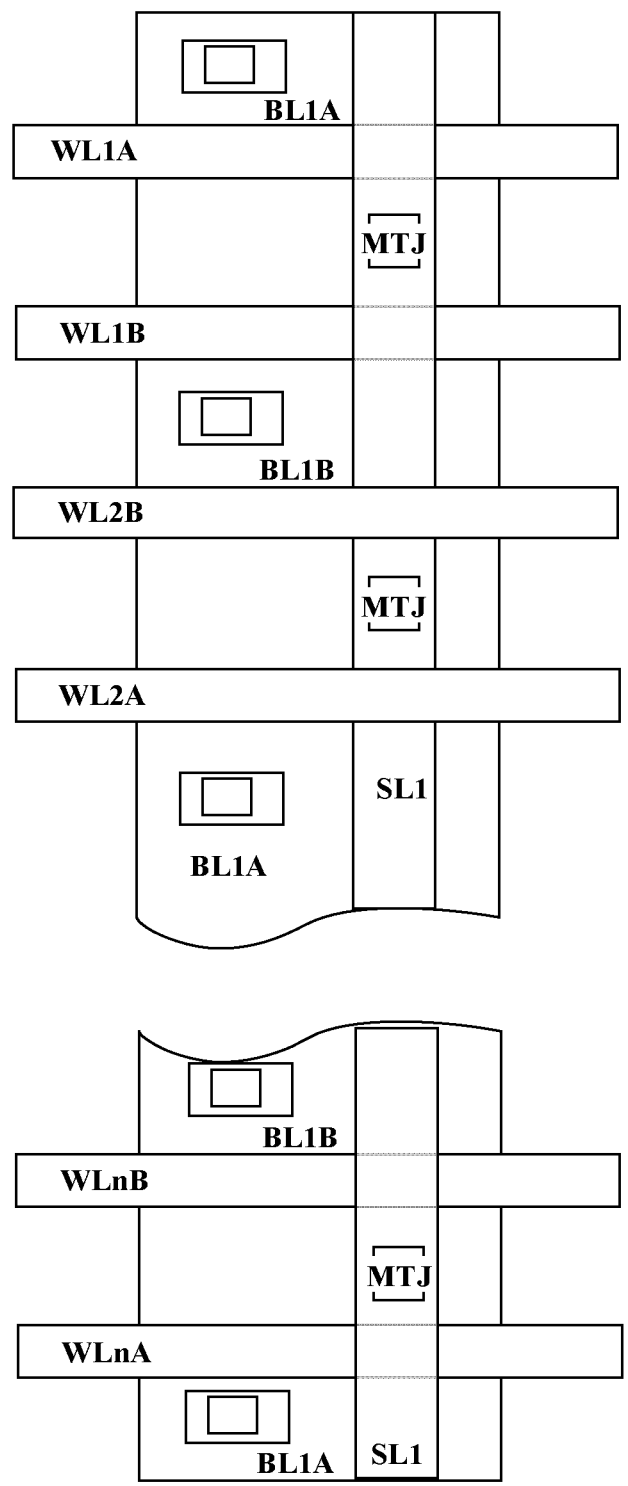
FIG. 6 shows a layout of a memory array according to this application.

FIG. 6 shows a layout of a memory array according to this application. Referring to FIG. 6, a layout corresponding to one memory column in FIG. 5 is shown. In the memory provided in this embodiment of this application, when each column of storage structures is disposed, first transistors 21 in adjacent storage structures are adjacent, and corresponding second transistors 22 are also disposed adjacently. In the first storage structure shown in FIG. 6, a first transistor 21 of the storage structure is located above a second transistor 22. Correspondingly, when the second storage structure is disposed, a second transistor 22 is located above a first transistor 21. When the third storage structure is disposed, a first transistor 21 is located above a second transistor 22. Transistors of the storage structures are sequentially arranged in such an order, so that when transistors are arranged in a column, first transistors 21 and second transistors 22 appear in pairs except transistors at head and tail ends.

In addition, for a memory column, as shown in FIG. 5, in the memory column, first transistors 21 are connected to the WLA, and second transistors 22 are connected to the WLB. In addition, during data reading, data at one address is read by using the WLA, and data at another address is read by using the WLB. Therefore, two first transistors 21 in adjacent memories are not supplied with power at the same time. Similarly, two second transistors 22 are not supplied with power at the same time. Therefore, in the memory provided in this embodiment of this application, second transistors 22 in two adjacent storage structures may share one contact hole to connect to the BLB, and first transistors 21 in the two adjacent storage structures share one contact hole to connect to the BLA. In this way, a size of the storage structures arranged in an array can be further reduced, thereby facilitating miniaturization of the storage structure array.

Figure 7:
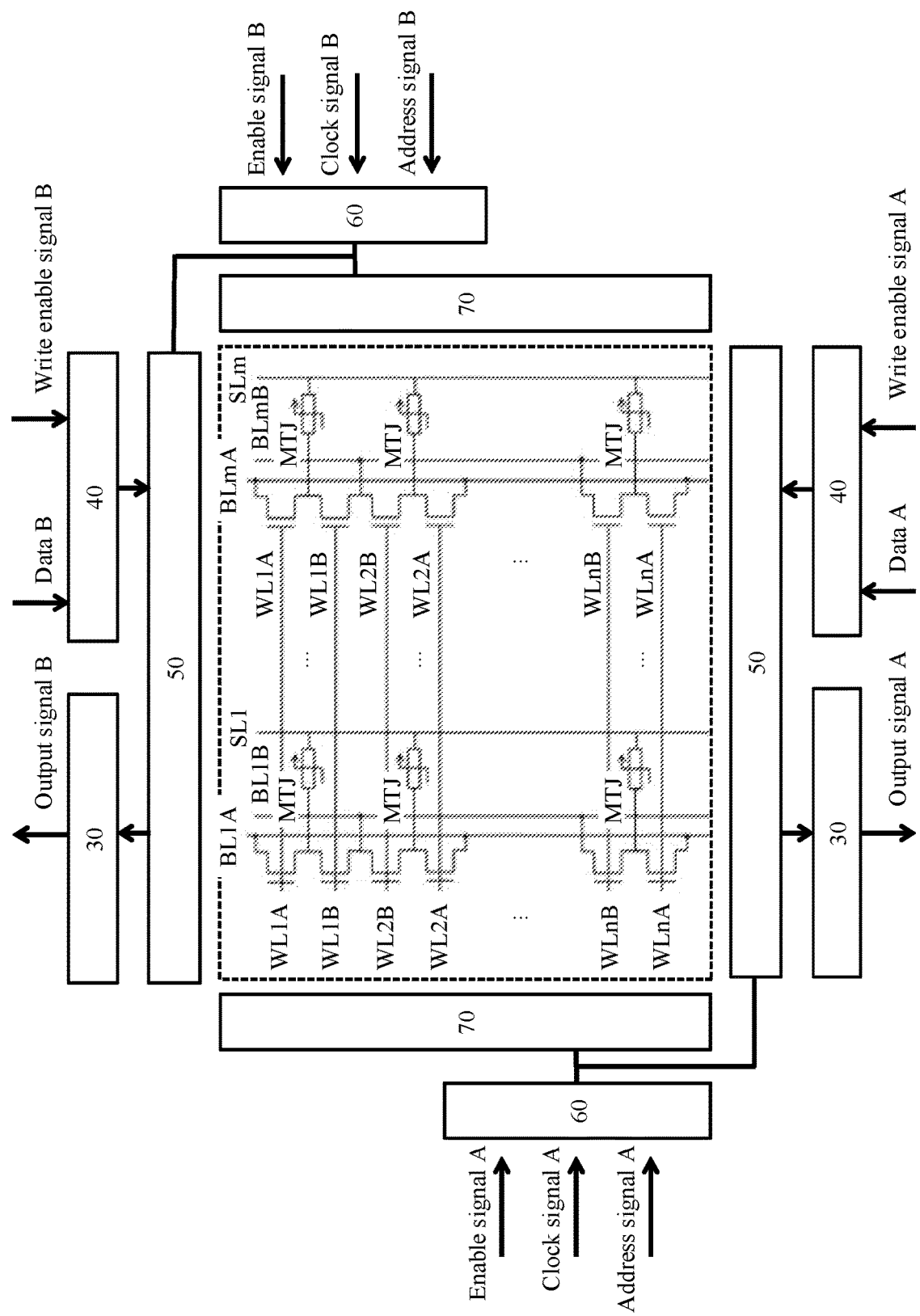
FIG. 7 is a schematic diagram of a memory according to an embodiment of this application.

FIG. 7 is a schematic diagram of a memory according to an embodiment of this disclosure. As shown in FIG. 7, there are a plurality of storage structures in the memory, and the plurality of storage structures are arranged in an array. In this way, an area of the memory is reduced, and data writing and reading in the memory is facilitated. When the memory is read, a case in which two WLAs or two WLBs are active at the same time does not occur. Therefore, when arrayed storage structures are disposed, transistors in adjacent storage structures may share an active area. In addition, sources or drains of second transistors 22 in the two adjacent storage structures may be connected to the BLB or the BLA through one contact hole.

Still referring to FIG. 7, each column in the array is formed by tightly splicing storage structures, adjacent storage structures shares a contact hole to connect to a bit line, and word lines are arranged in an ABBA order. That is, transistors are arranged in a manner of a first transistor 21, a second transistor 22, a second transistor 22, and a first transistor 21. In addition, FIG. 7 further shows a peripheral circuit. It should be understood that FIG. 7 merely shows the peripheral circuit as an example for ease of understanding the storage structure array provided in this embodiment of this application. The memory provided in this embodiment of this application may be connected to the array in the storage structures by using another existing circuit. Using FIG. 7 as an example, the array and the peripheral circuit are controlled by two sets of port signals, each including clock, address, and data signals. An enable signal A and an enable signal B, a clock signal A and a clock signal B, an address signal A and an address signal B are respectively connected to row decoders 70 (Row Decoder), column decoders 50, and multiplexers by using predecoders 60 (PreDecoder). An output signal of the row decoder 70 is connected to a signal of a word line in the array. The column decoder 50 and the multiplexer are connected to bit lines and source lines in the array. During reading, a signal on a bit line passes through the column decoder 50 and the multiplexer, and then recognized by a sense amplifier 30 and converted into an output signal A and an output signal B. During writing, when a write enable signal A and a write enable signal B are valid, data A and data B are connected from a write drive circuit 40 to a to-be-written column through the column decoder 50 and the multiplexer.

Figure 8:
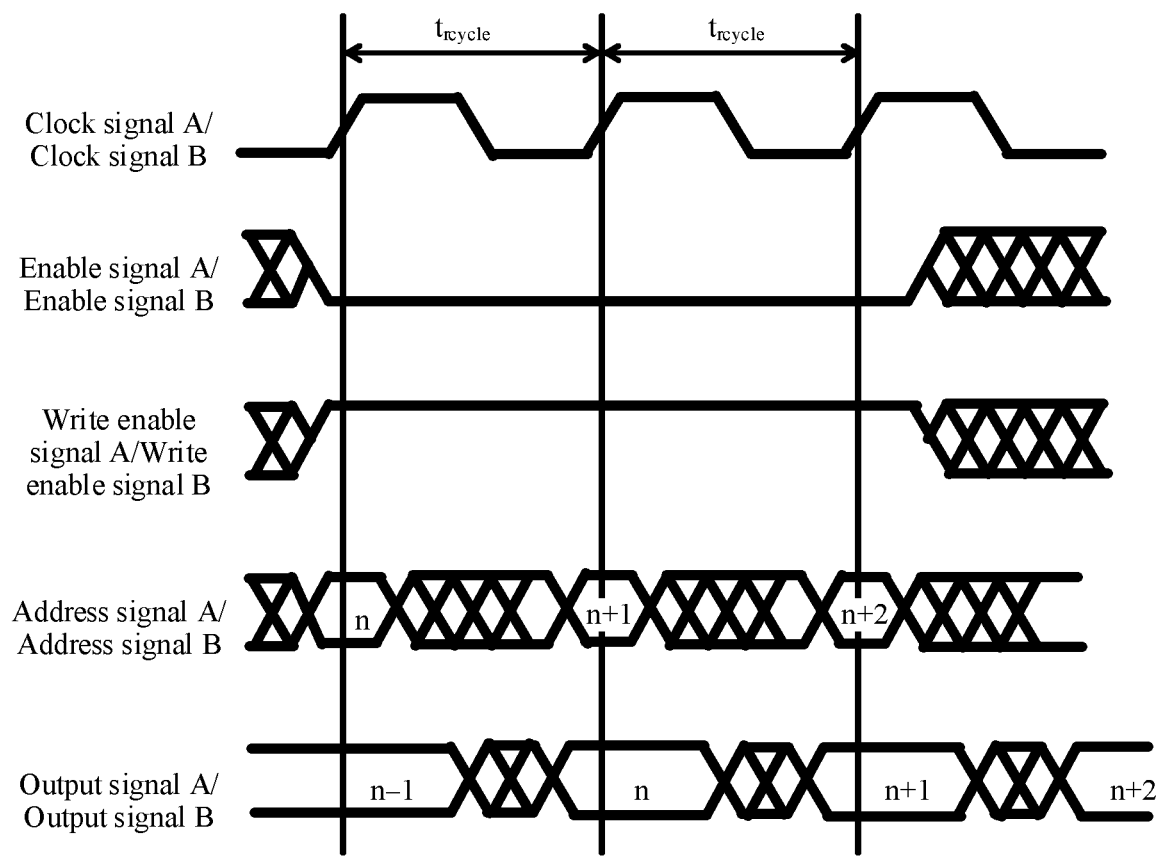
FIG. 8 is a read timing diagram of a memory according to an embodiment of this application.

For a read operation, because two transistors in each storage structure are respectively connected to word lines and bit lines of two ports, a maximum of two addresses can be read at the same time in the entire array. FIG. 8 is a read timing diagram of a memory according to an embodiment of this disclosure. Assuming that the set A of signals is considered, operations of the signals in a read cycle are as follows: The enable signal A is valid, the write enable signal A is set to an invalid bit, and the address signal A is ready before a rising edge of the clock signal A arrives. At a moment of a clock rising edge, the address signal is read, and after a specific time, data at a corresponding address is read to form the output signal A. In this way, reading is completed.

For a write operation, because two transistors in each storage structure need to be used in parallel to provide an adequate write current, during writing, address signals and data signals at the two ports need to be the same (which may be implemented by an internal circuit), two transistors in a same storage structure are turned on at the same time, and two bit lines are set to a same logical value, to implement writing. Only one write request can be processed at a time.

Figure 9:
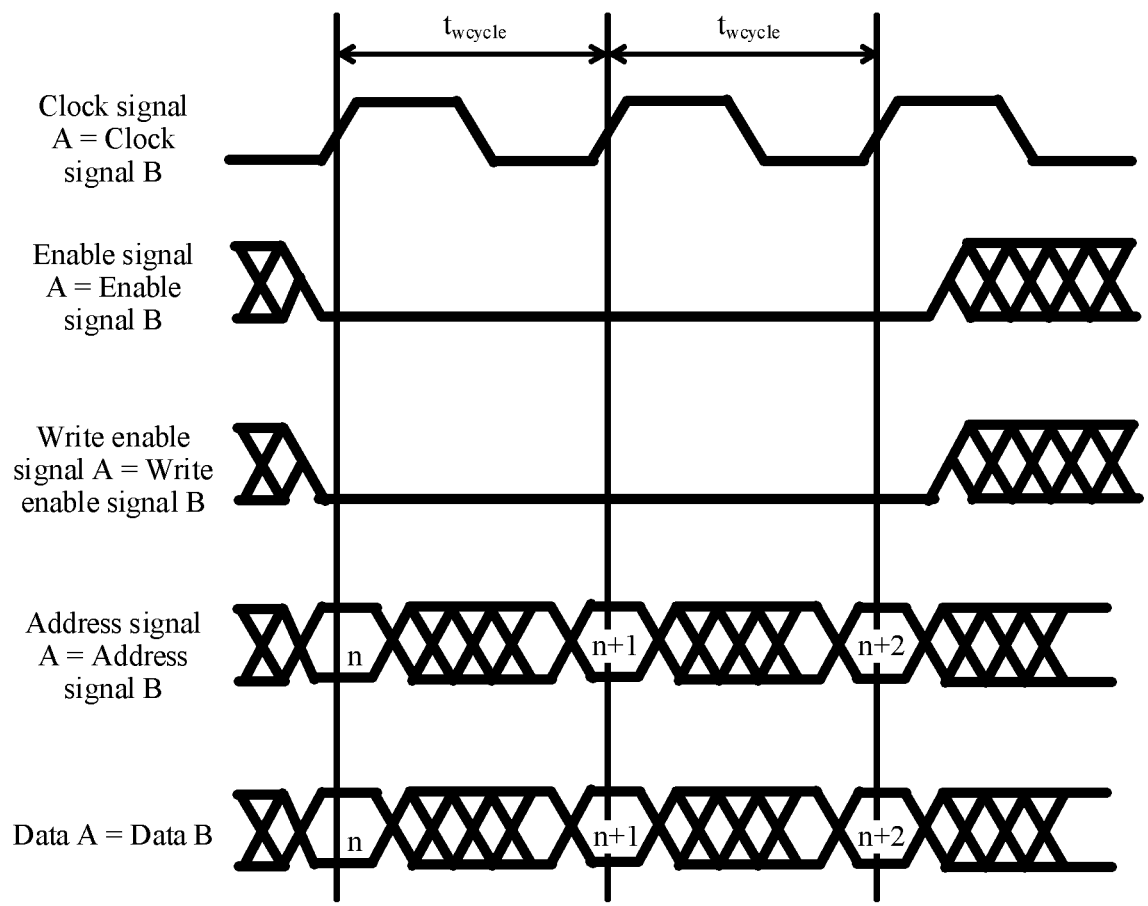
FIG. 9 is a write timing diagram of a memory according to an embodiment of this application.

FIG. 9 is a write timing diagram of a memory according to an embodiment of this disclosure. Operations of signals in a write cycle ($t_{wcycle}$) are as follows: The enable signal A and the enable signal B are the same and valid, the write enable signal A and the write enable signal B are the same and valid, and the address signal A and the address signal B as well as to-be-written data A and data B are ready before rising edges of the clock signal A and the clock signal B arrive. At a moment of a clock rising edge, the address signal and the to-be-written data are read, and after a specific time, the to-be-written data is successfully written to a corresponding address.

It can be learned from the foregoing description that the memory provided in this embodiment of this application may implement multi-port reading, and may process one write request. For a memory, a read operation is more frequent and important than a write operation. Therefore, in the memory provided in this embodiment of this application, based on an operating characteristic of the memory, the first transistor and the disposed second transistor are disposed for multi-port reading and single-port writing. Compared with the conventional technology in which two transistors are separately used for reading and writing, the memory provided in this embodiment of this application can implement reading from and writing to storage. In addition, both the turn-on current of the first transistor 21 and the turn-on current of the second transistor 22 are less than the write current of the storage element. Compared with providing a required write current by using one transistor, providing the write current by using the two transistors may enable a smaller transistor to meet a requirement, thereby reducing an area required by the entire memory. In addition, the memory in this application can still support a dual-port feature in a read operation. Compared with the conventional technology in which two separate transistors are used for reading and writing, an area occupied by the memory is greatly reduced.

In addition, an embodiment of this application further provides an electronic device. The electronic device includes the foregoing memory. The memory may implement multi-port reading, and may process one write request. For a memory, a read operation is more frequent and important than a write operation. Therefore, in the memory provided in this embodiment of this application, based on an operating characteristic of the memory, the first transistor and the disposed second transistor are disposed for multi-port reading and single-port writing. Compared with the conventional technology in which two transistors are separately used for reading and writing, the memory provided in this embodiment of this application can implement reading from and writing to storage. In addition, both the turn-on current of the first transistor 21 and the turn-on current of the second transistor 22 are less than the write current of the storage element. Compared with providing a required write current by using one transistor, providing the write current by using the two transistors may enable a smaller transistor to meet a requirement, thereby reducing an area required by the entire memory. In addition, the memory in this application can still support a dual-port feature in a read operation. Compared with the conventional technology in which two separate transistors are used for reading and writing, an area occupied by the memory is greatly reduced.

Obviously, a person skilled in the art can make various modifications and variations to this application without departing from the spirit and scope of this application. This application is intended to cover these modifications and variations of this application provided that they fall within the scope of protection defined by the following claims and their equivalent technologies.

What is claimed is:

1. A memory further including a storage element, comprising:
    a plurality of storage structures arranged in columns;
    a first bit line and a second bit line;
    a first transistor coupled to the first bit line;
    a second transistor coupled to the second bit line, wherein:
        the storage element is coupled to the first bit line and the second bit line separately via the first transistor and the second transistor; and
        the first transistor and the second transistor are configured to turned on together when a write operation is performed on the storage element; and
    wherein in each column of storage structures, first transistors and second transistors are alternately arranged in pairs.

2. The memory according to claim 1, wherein the memory further comprises a first word line and a second word line, and the first word line and the second word line are respectively coupled to a gate of the first transistor and a gate of the second transistor.

3. The memory according to claim 2, wherein the memory further comprises a control circuit, and the control circuit is configured to selectively turn on or off the first and second transistors by using the first word line and the second word line.

4. The memory according to claim 1, wherein the storage element is a magnetic tunnel junction.

5. The memory according to claim 1, wherein the storage element comprises a first end and a second end, and the first end is coupled to the first transistor and the second transistor; and
    the memory further comprises a source line, wherein the second end is coupled to the source line.

6. The memory according to claim 1, wherein the first transistor and the second transistor share an active area.

7. The memory according to claim 1, wherein both the first transistor and the second transistor are fin-type field effect transistors or planar transistors.

8. An electronic device that has a plurality of storage element structures arranged in columns, comprising:
    a first transistor;
    a second transistor;
    a first bit line;
    a second bit line; and
    wherein:
        the storage structures is coupled to the first bit line and the second bit line separately via the first transistor and the second transistor;
        the first transistor and the second transistor are configured to be turned on together when a write operation is performed on at least one of the storage structures; and
        each column of storage structures, first transistors and second transistors are alternately arranged in pairs.

9. A memory, wherein the memory comprises a plurality of storage structures arranged in a rectangular array, and a plurality of groups of bit lines that are in a one-to-one correspondence with a plurality of columns of the rectangular array; each group of bit lines comprises a first bit line and a second bit line;

each of the plurality of storage structures comprises a storage element that further includes a first transistor, and a second transistor;

the storage element is coupled to a corresponding first bit line and a corresponding second bit line by separately via the first transistor and the second transistor based on a row in which the storage structure is located in the rectangular array;

the first transistor and the second transistor are configured to be turned on together when a write operation is performed on the storage element; and wherein in each column of storage structures, first transistors and second transistors are alternately arranged in pairs.

10. The memory according to claim 9, wherein the memory further comprises a plurality of groups of word lines that are in a one-to-one correspondence with a plurality of rows of the rectangular array, each group of word lines comprises a first word line and a second word line, and a gate of the first transistor and a gate of the second transistor are coupled to a corresponding first word line and second word line respectively based on the row in which the storage structure is located in the rectangular array.

11. The memory according to claim 10, wherein the memory further comprises a control circuit, and the control circuit is configured to turn on or off the first transistor and the second transistor by using the first word line and the second word line.

12. The memory according to claim 9, wherein the first transistor and the second transistor share an active area.

13. The memory according to claim 9, wherein adjacent first transistors share a first contact hole to connect to the first bit line, and adjacent second transistors share a second contact hole to connect to the second bit line.

14. An electronic device, comprising:

a memory that comprises a plurality of storage structures alternately arranged in a rectangular array, and a plurality of groups of bit lines that are in a one-to-one correspondence with a plurality of columns of the rectangular array; each group of bit lines comprises a first bit line and a second bit line;

each of the plurality of storage structures comprises a storage element that includes a first transistor, and a second transistor;

the storage element is coupled to a corresponding first bit line and a corresponding second bit line by separately via the first transistor and the second transistor based on a row in which the storage structure is located in the rectangular array; and wherein in each column of storage structures, first transistors and second transistors are alternately arranged in pairs the first transistors and the second transistors are configured to be turned on together when a write operation is performed on the storage element.

\* \* \* \* \*